United States Patent
Duan et al.

(10) Patent No.: US 7,182,793 B2
(45) Date of Patent: Feb. 27, 2007

(54) SYSTEM FOR REDUCING OXIDATION OF ELECTRONIC DEVICES

(75) Inventors: Rong Duan, Singapore (SG); Ka Shing Kenny Kwan, Singapore (SG)

(73) Assignee: ASM Technology Singapore Pty Ltd., Singapore (SG)

(*) Notice: Subject to any disclaimer, the term of this patent is extended or adjusted under 35 U.S.C. 154(b) by 113 days.

(21) Appl. No.: 10/764,162

(22) Filed: Jan. 22, 2004

(65) Prior Publication Data
US 2005/0161488 A1   Jul. 28, 2005

(51) Int. Cl.
*H01L 21/00* (2006.01)
*H01L 21/64* (2006.01)
(52) U.S. Cl. ....................... 29/25.01; 228/42
(58) Field of Classification Search ............... 228/42; 29/25.01
See application file for complete search history.

(56) References Cited

U.S. PATENT DOCUMENTS

| 5,265,788 | A |   | 11/1993 | Ozawa et al. ............ 228/42 |
| 5,364,007 | A | * | 11/1994 | Jacobs et al. ............ 228/42 |
| 5,569,075 | A | * | 10/1996 | Leturmy ................. 454/66 |
| 6,866,182 | B2 | * | 3/2005 | Wong et al. ............ 228/219 |

* cited by examiner

*Primary Examiner*—Fernando L. Toledo
(74) *Attorney, Agent, or Firm*—Ostrolenk, Faber, Gerb & Soffen, LLP

(57) ABSTRACT

The invention provides a system for reducing oxidation of a semiconductor device when it is heated, for example during wire bonding. A holding device is provided for securing the semiconductor device to a platform. The holding device includes an opening for providing access to an area where the semiconductor device is to be heated and a cavity is coupled to the opening. A gas inlet in fluid communication with the cavity supplies a relatively inert gas to the cavity, whereby to transmit the inert gas to the opening through the cavity and to reduce oxidation of the semiconductor device.

7 Claims, 3 Drawing Sheets

SYSTEM FOR REDUCING OXIDATION OF ELECTRONIC DEVICES

FIELD OF THE INVENTION

The invention relates to an apparatus and method to minimize oxidation of electronic devices made from certain reactive metals, such as leadframes or other carriers, during semiconductor package assembly processes. The invention is particularly applicable to ultrasonic wire bonding in relation to the use of copper or copper alloy leadframes, although it is capable of wider application.

BACKGROUND AND PRIOR ART

Semiconductor leadframes serve as substrates for the manufacture of certain semiconductor packages. Conventionally, leadframes are made from iron alloys. However, with an increasing demand for higher performance miniaturized packages, more reactive metals, in particular copper alloy leadframes are finding increasing applications in semiconductor packages. These leadframes are found to be more attractive than iron alloy leadframes due to factors such as better heat dissipation, ease of processing and cost. On the other hand, the disadvantage of copper alloy is that it is prone to oxidation (ie. it reacts with oxygen to produce copper oxide) when exposed to oxygen in the air at high temperatures. Such oxidation results in oxygen forming weak bonds with the atoms at the leadframe surface, and a layer of brittle and/or poorly adhering oxides. Thus, oxidation introduces reliability problems for microelectronic packages.

The problem of oxidation is particularly acute during wire-bonding in a typical semiconductor packaging process, wherein conductive bonding wires are bonded to contact surfaces on a semiconductor die and a leadframe to establish electrical connections therebetween. This bonding is commonly done by using an ultrasonic transducer to generate mechanical vibration energy with an external pressure force to bind the wire to the die and leadframe surfaces. However, heat generated during the process may oxidize the surface of the leadframe, leading to non-stick or unreliability of the bond. Oxidation during the wire-bonding process should thus be arrested or reduced.

A typical wire bonder uses a window clamp, which is usually rectangular in design, to clamp a leadframe securely to a top plate. An industry practice for protecting leadframes from oxidation is to introduce large amounts of a relatively inert gas, usually nitrogen gas, to the leadframe. Various apparatus have been used to do this. In a typical apparatus, an area of the leadframe is covered by the body of the clamp and is thus relatively well-protected from oxidation, leaving an opening inside the body of the window clamp as a bonding area. The bonding area is exposed to the atmosphere, and is most vulnerable to oxidation.

One method of introducing nitrogen gas is to locate one or more nozzles next to the bonding area to blow nitrogen gas into the bonding area. (FIG. 1) The nitrogen in the environment around the bonding area would tend to inhibit oxidation reaction of the leadframe at the high bonding temperatures. However, the use of nozzles creates a negative pressure around the region of the nozzle opening, sucking air towards the nozzle opening. After several minutes, the effectiveness of the nozzle will be diminished due to the oxygen drawn in from the atmosphere mixing with the nitrogen gas discharge.

An example of such a method is disclosed in U.S. Pat. No. 5,265,788 entitled, "Bonding Machine with Oxidization Preventive Means". The oxidation preventive assembly described is made up of two pipes installed on a bonding stage. The two pipes are formed with gas discharge holes and their terminal ends are closed by a block to prevent a back-flow of the gas supplied into the pipes. Thus, a uniform gas atmosphere is created around the workpiece which is placed on the bonding stage, preventing oxidation of the workpiece. Nevertheless, due to the negative pressure around the gas discharge holes as explained above, oxygen will consequently be drawn in from the atmosphere so that the effectiveness of the assembly is reduced.

Another method of introducing nitrogen gas is to have one or more gas blower outlets in a top plate on which the leadframe rests for the gas to be discharged into the bonding area. (FIG. 2) This method has a disadvantage in that it is difficult for a manufacturer to manufacture a top plate with many small holes as outlets for the nitrogen gas, bearing in mind that the surface of the top plate has to be substantially even to allow wire-bonding to be effectively performed on it.

This design also has the problem of negative pressure being created around the outlets of the top plate. After a while, the negative pressure causes oxygen in the air to be drawn to the openings and mixed with nitrogen gas, reducing its effectiveness. Furthermore, it should be appreciated that such a method only works where the surface of the leadframe itself has through-holes to allow gas to enter the bonding area inside the wire clamp. If there are no such through-holes, the method is not effective.

A third method is to use a movable cover together with the first method and/or the second method (FIG. 3), its purpose being to prevent as far as possible nitrogen gas from escaping from the bonding area. The movable cover has a through-hole to allow a capillary of a bonding member to extend into the bonding area. However, the addition of an additional part to the wire bonder (specifically, the bond head of the wire bonder) affects the bonding performance of the machine. The cover will also block an operator's view of the leadframe as it is being bonded, and makes the bond area inaccessible when, for example, a bond wire breaks. The cover size is also too large when there is a large bond area. Moreover, there is a risk of the wire clamp hitting the moving cover when the wire clamp is moved up to release a leadframe.

SUMMARY OF THE INVENTION

It is thus an object of the invention is to seek to minimize the formation of a negative pressure around the gas outlets introducing an inert gas onto a semiconductor device during bonding.

According to a first aspect of the invention, there is provided a system for reducing oxidation of a semiconductor device comprising: a holding device for securing the semiconductor device to a platform, including an opening in the holding device for providing access to an area where the semiconductor device is to be heated; a cavity coupled to the opening; and a gas inlet in fluid communication with the cavity for supplying a relatively inert gas to the cavity, whereby to transmit the inert gas to the opening through the cavity.

According to a second aspect of the invention, there is provided a method for reducing oxidation of a semiconductor device comprising the steps of: securing the semiconductor device to a platform with a holding device including an opening; positioning the opening of the holding device over an area of the semiconductor device where it is to be heated for providing access thereto; providing a cavity coupled to the opening; supplying a relatively inert gas into the cavity; and transmitting the inert gas to the opening through the cavity.

It would be convenient hereinafter to describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

Examples of a system and method in accordance with the invention will now be described with reference to the accompanying drawings, in which.

DETAILED DESCRIPTION OF THE PREFERRED EMBODIMENTS

Figure 1:
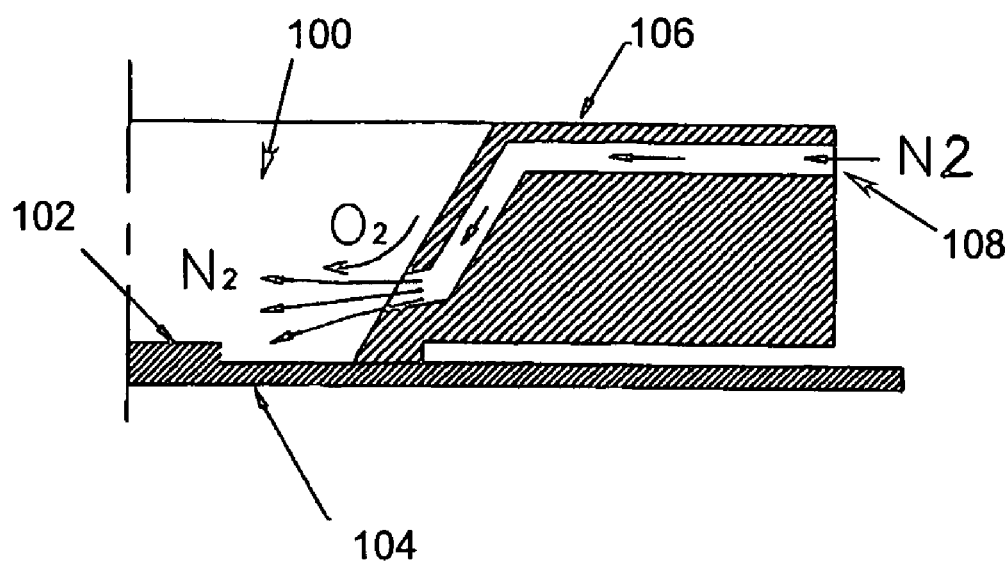
FIG. 1 is a cross-sectional view of nitrogen gas being introduced to a bonding area of a leadframe through a nozzle in a window clamp according to a first example of the prior art.

Referring to the drawings, in which like parts are referred to by like numerals, FIG. 1 is a cross-sectional view of a relatively inert gas, in this case nitrogen gas ($N_2$), being introduced to a bonding area 100 of a leadframe 104 through a nozzle 108 in a window clamp 106 according to a first example of the prior art. A die 102 attached to the leadframe 104 is located substantially centrally in an opening of the window clamp 106 to allow wire bonding to take place to connect electrical contacts on the die 102 and the leadframe 104.

As the wire bonding process is being performed, nitrogen gas is pumped through the nozzle 108 into the bonding area 100, to fill the environment in the bonding area with nitrogen gas, thereby protecting the leadframe from oxidation during wire bonding. However, due to a nozzle effect, low pressure will be created around the opening of the nozzle 108 such that oxygen ($O_2$) from the atmosphere is drawn in and mixed with the nitrogen. As a result, the effectiveness of pumping nitrogen gas into the bonding area to prevent oxidation is reduced.

Figure 2:
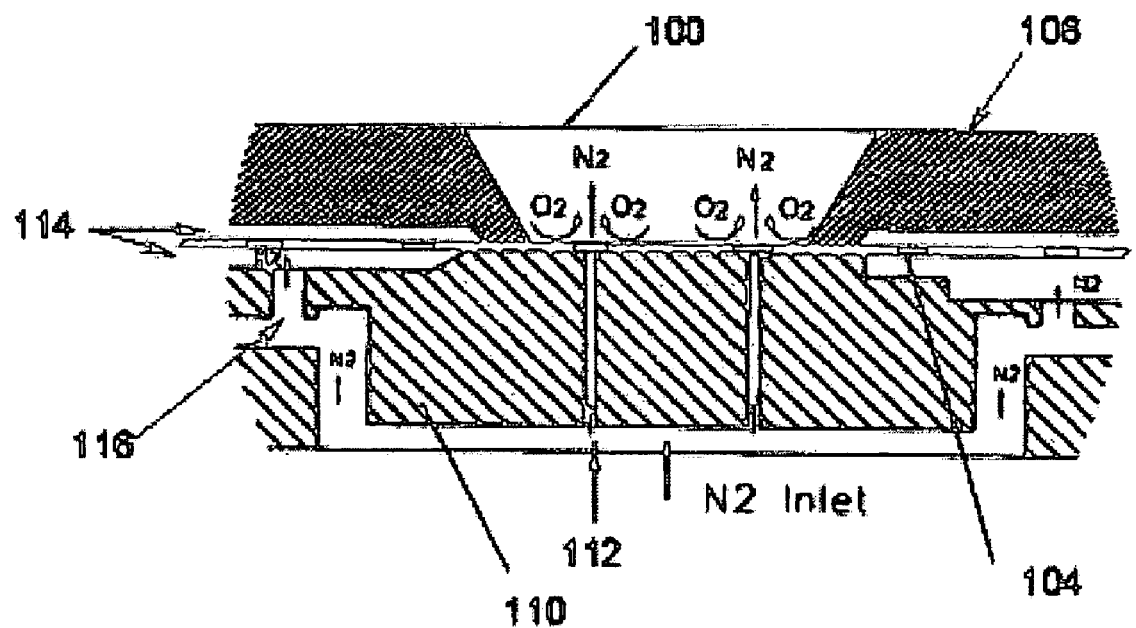
FIG. 2 is a cross-sectional view of nitrogen gas being introduced to the bonding area through gas outlets in a top plate carrying a leadframe according to a second example of the prior art.

FIG. 2 is a cross-sectional view of nitrogen gas being introduced to the bonding area 100 through gas outlets 112 in a top plate 110 carrying a leadframe 104 according to a second example of the prior art. In this design, nitrogen gas is introduced from below the leadframe 104, so this design is applicable generally only if there are openings on the leadframe 104 to allow nitrogen gas to pass through it and into the bonding area 100.

Besides blowing nitrogen gas into the bonding area 100, nitrogen gas may also be blown through secondary outlets 116 to portions 114 of the leadframe 104 between the window clamp 106 and top plate 110 outside the bonding area 100, although these portions 114 are not critical because they are less exposed to the atmosphere. Thus, other means may be used to separately introduce nitrogen gas to these portions 114.

Nevertheless, the nozzle effect will also occur in this design so that oxygen is drawn to the outlets and into the bonding area 100, thereby reducing the effectiveness of the apparatus.

Figure 3:
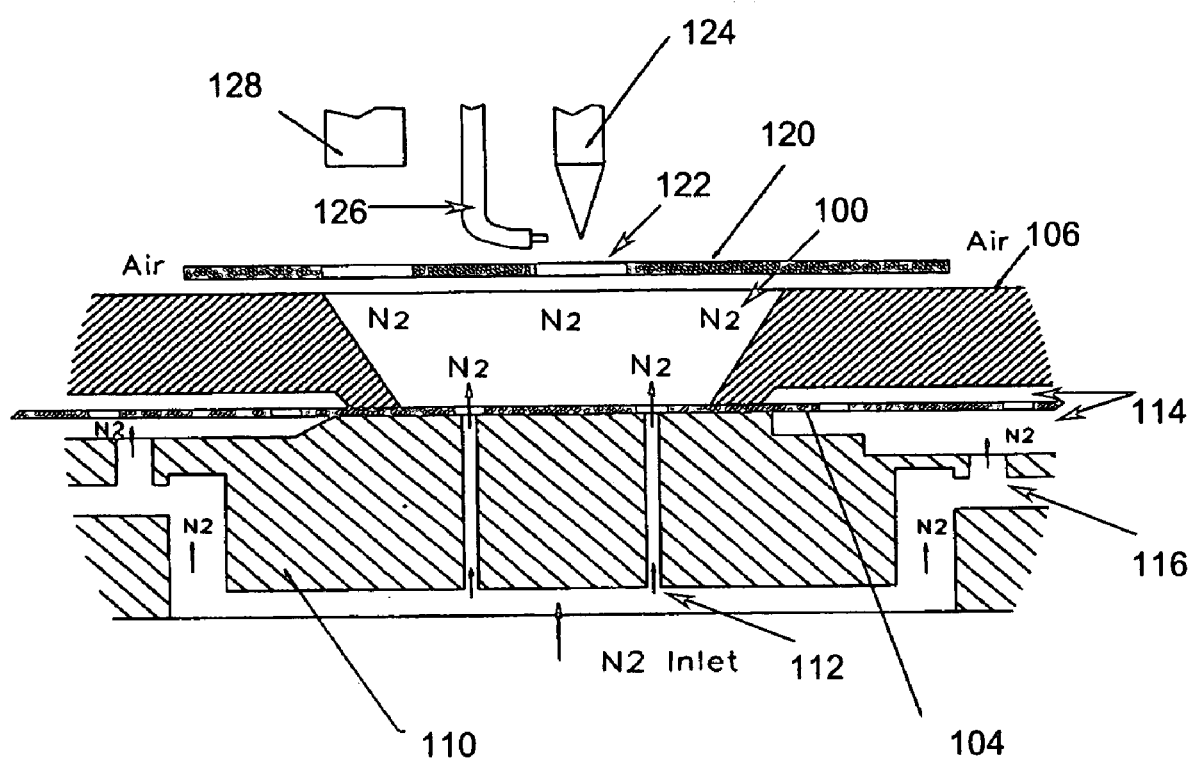
FIG. 3 is a cross-sectional view of a moving cover positioned over a window clamp to keep nitrogen gas inside the bonding area from escaping according to a third example of the prior art.

FIG. 3 is a cross-sectional view of a movable cover 120 positioned over a window clamp 106 to keep nitrogen gas inside the bonding area 100 from escaping according to a third example of the prior art. The movable cover 120 has a through-hole 122 to allow a capillary 124 carrying bonding wire to pass through the movable cover 120. A flame-off device 126 generates an electrical spark to form a ball bond when performing the wire bonding operation. The movable cover 120 is mounted on a bond-head of a wire bonder so as to move together with the bond head. An optical device 128 is used for Pattern Recognition (PR). Nitrogen gas may be introduced to the bonding area 100 through nozzle inlets 112 leading to outlets in a top plate 110 as well as secondary gas inlets 116.

Figure 4:
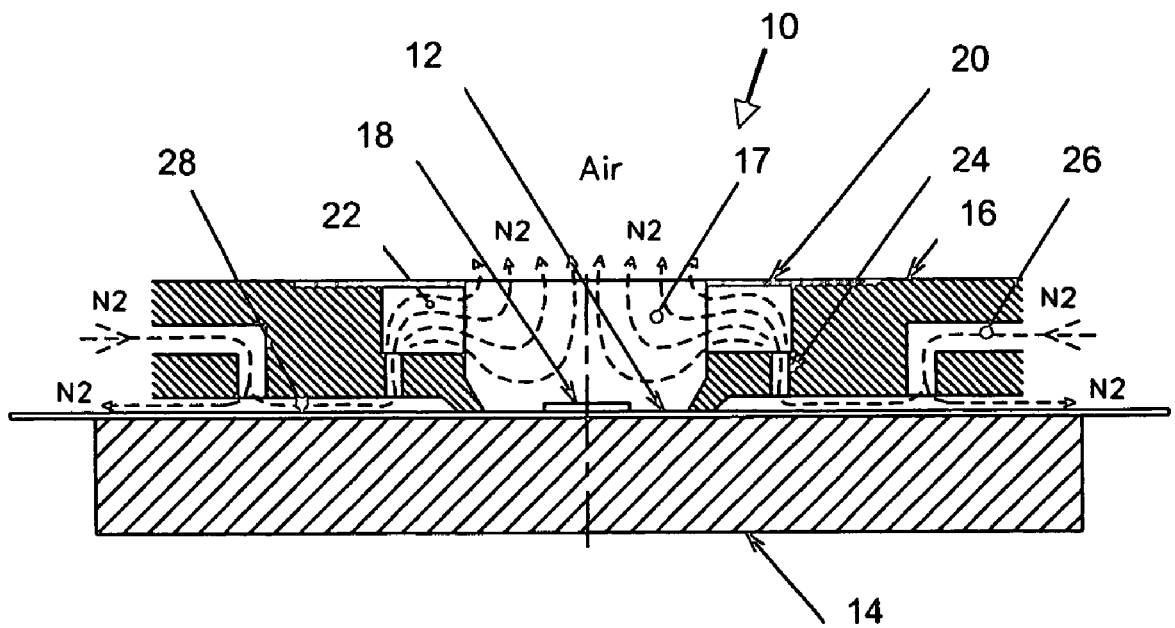
FIG. 4 is a cross-sectional view of a system for introducing nitrogen gas into a bonding area according to a first embodiment of the invention.

FIG. 4 is a cross-sectional view of a system 10 for introducing a relatively inert gas such as nitrogen gas into an opening 17 leading to a bonding area according to a first embodiment of the invention. A semiconductor device, in the form of a leadframe 12 carrying a die 18, is placed onto a platform or top plate 14 of a wire bonding machine. The top plate 14 includes heating elements to raise a temperature of the leadframe 12. A holding device in the form of a window clamp 16 is clamped onto the leadframe 12 to secure it onto the top plate 14. An opening 17 of the window clamp 16 is positioned over the leadframe 12 to provide access to the bonding area, where the leadframe 12 is to be heated through heating by the top plate 14 as well as through ultrasonic welding by the wire bonding operations. The bonding area comprising the die 18 and part of the leadframe 12 is thus exposed for wire bonding.

The window clamp 16 is fabricated with a cavity 22 coupled to the opening 17 and an outlet connects the cavity 22 to the opening 17. A cover 20 is used on a top surface of the window clamp 16 to cover the cavity 22 and to limit its exposure to the general atmosphere containing oxygen ($O_2$). The cover may also be used to divert the nitrogen gas to the opening 17, as described below.

The window clamp 16 also includes a number of conduits 24 inside it for diverting nitrogen gas into the cavity 22. They are arranged such that nitrogen gas is transmitted into the opening 17 after passing through the cavity 22. The nitrogen gas is fed via gas inlets 26 in the window clamp 16 leading from a gas supply outside the window clamp 16. The gas inlets 26, cavity 22 and opening 17 are in fluid communication with one another. It is preferable that the supply of nitrogen by the conduits 24 is directed away from the outlet connecting the cavity 22 and the opening 17. Therefore, the nitrogen is not blowing directly into the opening 17 so as to reduce negative pressure that may be created around the leadframe 12. In this design, the supply of nitrogen is directed at the cover 20, which then diverts nitrogen into the opening 17. In the illustrated design, the cavity 22 has a substantially larger cross-sectional area than the conduits 24, in order to reduce the pressure of nitrogen gas introduced into the opening 17 from the cavity 22, as compared to the pressure of nitrogen gas introduced into the cavity 22 from the conduits 24.

There is also a hollow space 28 at a bottom surface of the window clamp 16 between the window clamp 16 and the top plate 14 or platform. The space 28 receives nitrogen from the gas inlets 26 and serve to channel nitrogen gas into the cavity 22 through the conduits 24. Additionally, the space 28 also distributes nitrogen gas to other parts of the leadframe 12 outside the opening 17 so that these parts of the leadframe 12 are protected from oxidation. At an end of the space 28 remote from the bonding area 17, the space 28 may lead directly outside to the general atmosphere.

An advantage of using the cavity 22 intermediate the gas supply from the gas inlets 26 and the opening 17 is that it contributes to even distribution of nitrogen over a larger area when nitrogen gas is introduced into the opening 17. It has been found that this effectively reduces negative pressure around the outlet region where nitrogen gas is introduced into the opening 17 and therefore the bonding area, whereas the conduits 24 which may give rise to negative pressure are situated further away from the general atmosphere. In turn, the effectiveness of the nitrogen gas to prevent oxidation of the leadframe 12 during wire bonding is increased since the problem of oxygen gas being mixed with nitrogen gas is obviated.

Figure 5:
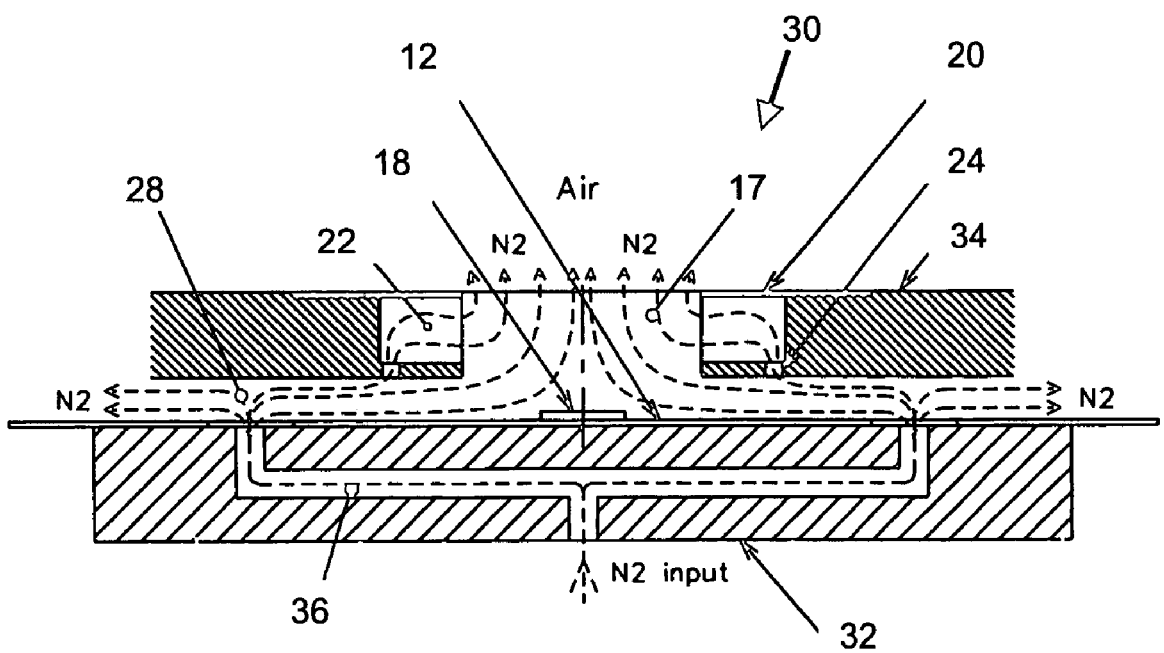
FIG. 5 is a cross-sectional view of a system for introducing nitrogen gas into a bonding area according to a second embodiment of the invention.

FIG. 5 is a cross-sectional view of a system 30 for introducing nitrogen gas into an opening 17 leading to a bonding area according to a second embodiment of the invention. In this embodiment, the leadframe 12 is again placed on top of a top plate 32 and a window clamp 34 is clamped onto the leadframe 12 to secure it. A die 18 and part of the leadframe 12 are exposed in a bonding area for wire bonding. However, the difference with the first embodiment is that nitrogen gas is introduced from gas channels 36 formed in the top plate 32. The gas channels 36 are connected to a nitrogen gas supply. In order to utilize this embodiment, the leadframe 12 should preferably have through-holes allowing nitrogen gas to flow from the top plate 32 to a top or bonding surface of the leadframe 12.

The window clamp 34 according to this embodiment is also formed with a cavity 22 coupled to the opening 17 leading to the bonding area. Gas conduits 24 are formed in the window clamp 34 leading to the cavity 22 from within the window clamp 34. The cavity 22 is covered by a cover 20 placed over the top surface of the window clamp. There is a hollow space 28 at the bottom surface of the window clamp 34 between the window clamp 34 and the top plate 32 or platform. The space 28 is connected to the opening 17. Nitrogen gas from the gas channels 36 is fed into the space 28 and is distributed towards the bonding area and opening 17 as well as lead to the general atmosphere outside the window clamp 34 at an opposite end.

Some of the nitrogen gas distributed towards the opening 17 flows directly through to the opening 17. Some of the nitrogen gas is led through the gas conduits 24 linking the cavity 22 and the space 28 into the cavity 22. From the cavity 22, the nitrogen gas is transmitted towards the opening 17 and bonding area.

The first and second embodiments may be used in combination so that nitrogen gas is introduced both via the window clamp 16 as well as the top plate 14 simultaneously. The various approaches as described in the preferred embodiments aid in reducing oxidation for a longer time as compared to the prior art.

Using the above embodiments of the invention, it was found that the problem of negative pressure around the bonding area due to gas nozzles or conduits supplying nitrogen gas was alleviated. Therefore, the ability of the system to reduce the oxidation of the devices being bonded was noticeably improved.

The invention described herein is susceptible to variations, modifications and/or additions other than those specifically described and it is to be understood that the invention includes all such variations, modifications and/or additions which fall within the spirit and scope of the above description.

The invention claimed is:

1. A system for reducing oxidation of a semiconductor devices comprising:
    a holding device for securing a lead frame for the semiconductor device to a platform, the holding device including an opening providing access by a bonding tool to an area where the semiconductor device is to be heated;
    the holding device further including a cover, the cover defining a hollow cavity located adjacent to the opening;
    a gas inlet in fluid communication with the cavity and the opening for supplying a relatively inert gas; and
    the holding device further defining a conduit connecting the gas inlet and hollow cavity, the conduit having a smaller cross-sectional area than the cavity, the conduit for transmitting the inert gas to the opening through the cavity.

2. A system a claimed in claim 1, wherein the cavity is configured such that the inert gas supplied to the cavity is directed away from an outlet connecting the cavity to the opening.

3. A system as claimed in claim 1, wherein the gas inlet is formed in the holding device.

4. A system as claimed in claim 1, wherein the gas inlet is formed in the platform.

5. A system as claimed in claim 1, wherein a space is defined between the holding device and the platform for receiving the inert gas from the gas inlet and for distributing the inert gas over a surface of the electronic device.

6. A system as claimed in claim 5, wherein the space is connected to the said opening for distributing an amount of the inert gas directly from the space to the opening.

7. A system as claimed in claim 5, wherein the conduit links the cavity and the space and channels an amount of the inert gas from the space to the cavity.

* * * * *

UNITED STATES PATENT AND TRADEMARK OFFICE
CERTIFICATE OF CORRECTION

PATENT NO.         : 7,182,793 B2                                      Page 1 of 1
APPLICATION NO. : 10/764162
DATED                : February 27, 2007
INVENTOR(S)        : Rong Duan et al.

It is certified that error appears in the above-identified patent and that said Letters Patent is hereby corrected as shown below:

On Title page
Item (73) Assingee:

Insert
ASM Technology Singapore Pte Ltd

Signed and Sealed this

Fifteenth Day of May, 2007

JON W. DUDAS
*Director of the United States Patent and Trademark Office*